(12) United States Patent
Sakata

(10) Patent No.: US 10,871,710 B2
(45) Date of Patent: Dec. 22, 2020

(54) IMPRINT APPARATUS, IMPRINT METHOD, AND ARTICLE MANUFACTURING METHOD

(71) Applicant: CANON KABUSHIKI KAISHA, Tokyo (JP)

(72) Inventor: Yuji Sakata, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 221 days.

(21) Appl. No.: 15/906,286

(22) Filed: Feb. 27, 2018

(65) Prior Publication Data
US 2018/0253001 A1    Sep. 6, 2018

(30) Foreign Application Priority Data

Mar. 3, 2017    (JP) .................................. 2017-040920

(51) Int. Cl.
*G03F 7/00*    (2006.01)
*B29C 59/02*   (2006.01)
(Continued)

(52) U.S. Cl.
CPC ............ *G03F 7/0002* (2013.01); *B29C 35/08* (2013.01); *B29C 59/002* (2013.01); *B29C 59/026* (2013.01); *B29L 2031/3406* (2013.01)

(58) Field of Classification Search
CPC .............................. B29C 35/08; B29C 59/002
See application file for complete search history.

(56) References Cited

U.S. PATENT DOCUMENTS 9,263,289 B2    2/2016  Hattori et al.
2009/0085255 A1*  4/2009  Tada ................. B82Y 10/00
                                                264/401
(Continued)

FOREIGN PATENT DOCUMENTS

JP    2012134466 A    7/2012
JP    2014003123 A    1/2014
(Continued)

OTHER PUBLICATIONS

Office Action issued in Korean Appln. No. 10-2018-0024181 dated Jul. 22, 2020.

*Primary Examiner* — Jacob T Minskey
*Assistant Examiner* — Virak Nguon
(74) *Attorney, Agent, or Firm* — Rossi, Kimms & McDowell LLP

(57) ABSTRACT

An imprint apparatus performs imprint processing of supplying a second composition having a property of being cured onto a substrate to which a first composition not having a property of being cured in an uncured state is supplied, bringing a mold into contact with a mixed layer of the first composition and the second composition, which is formed by the supplying, curing the mixed layer, separating the mold from the cured mixed layer, and forming a pattern on the mixed layer. When unloading the substrate outside the apparatus before completion of the imprint processing for all shot regions of the substrate, the apparatus supplies the second composition to a portion on the substrate in which the first composition is in an uncured state and performs curing processing of curing the mixed layer formed in the portion before the unloading.

9 Claims, 12 Drawing Sheets

(51) Int. Cl.
  *B29C 35/08* (2006.01)
  *B29C 59/00* (2006.01)
  *B29L 31/34* (2006.01)

(56) References Cited

U.S. PATENT DOCUMENTS

| | | | | |
|---|---|---|---|---|
| 2012/0141659 A1* | 6/2012 | Sato | ................ | B82Y 10/00 |
| | | | | 427/8 |
| 2013/0126472 A1* | 5/2013 | Suzuki | ................ | B29C 33/38 |
| | | | | 216/47 |
| 2016/0236381 A1* | 8/2016 | Takemura | ............ | B29C 43/021 |
| 2018/0039170 A1 | 2/2018 | Kato et al. | | |

FOREIGN PATENT DOCUMENTS

| | | | |
|---|---|---|---|
| JP | 2016146468 A | 8/2016 | |
| JP | 2016149510 A | 8/2016 | |
| JP | 2016164977 A | 9/2016 | |
| KR | 1020160100232 A | 8/2016 | |
| WO | WO-2016120944 A1 * | 8/2016 | ........... G03F 7/0002 |

* cited by examiner

F I G. 7
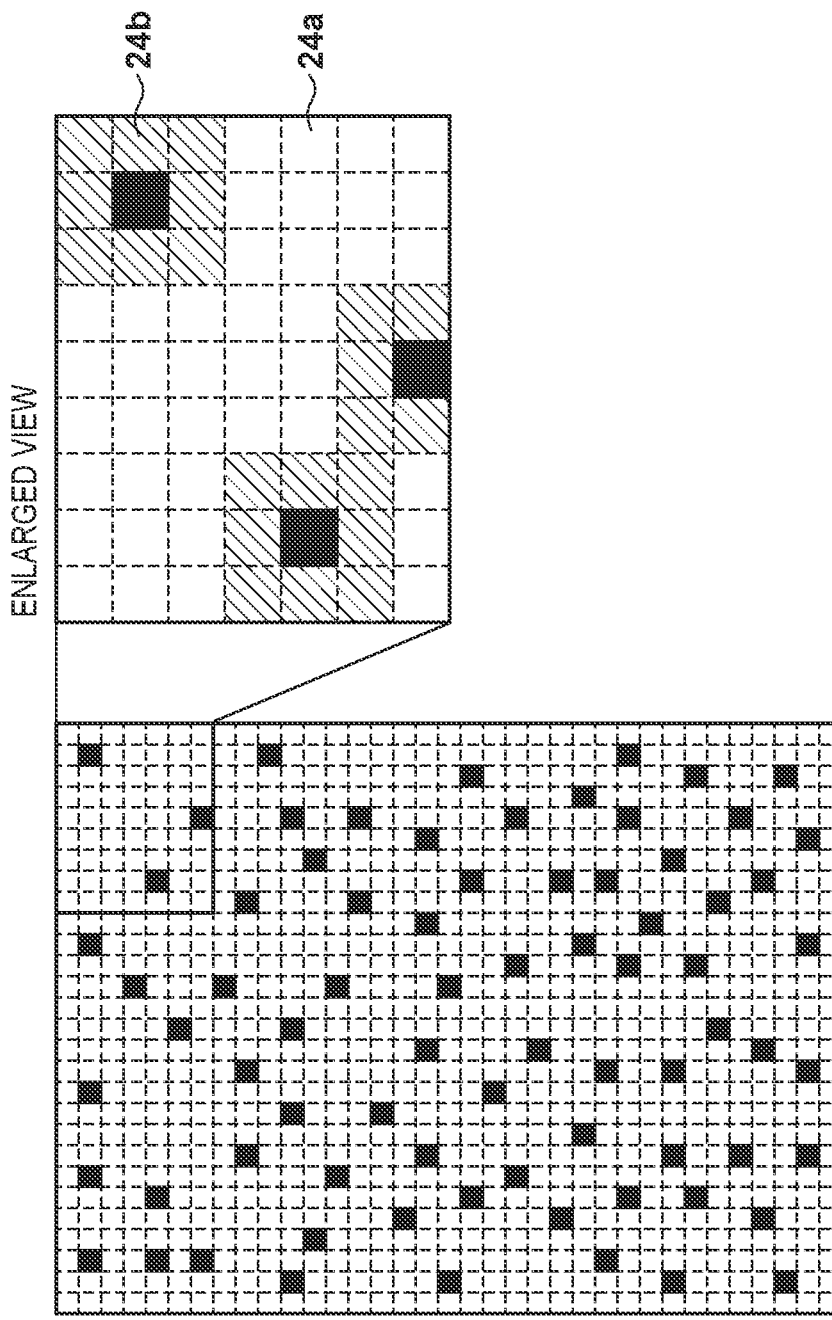

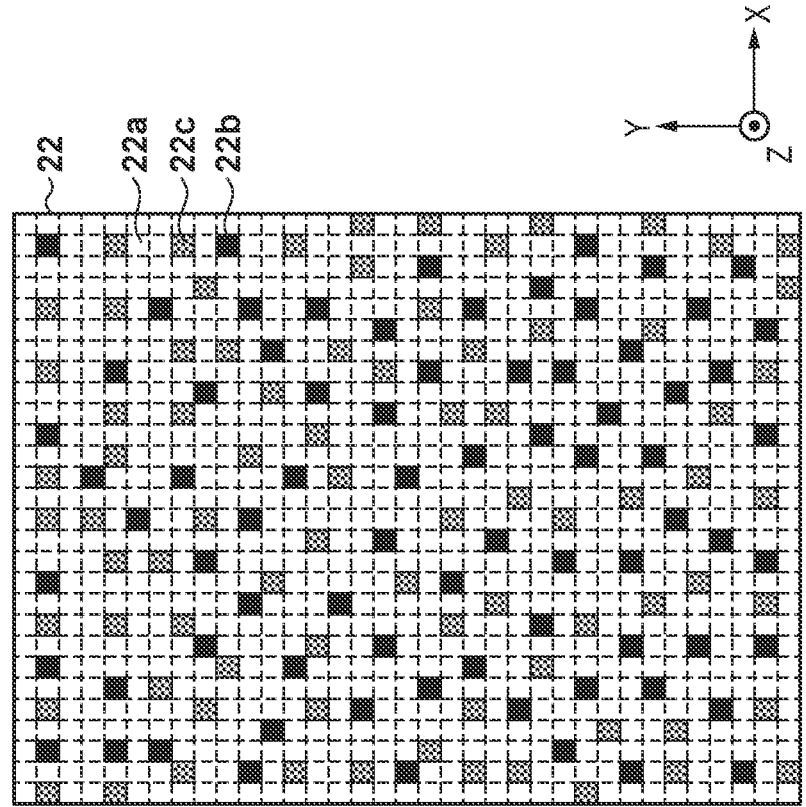
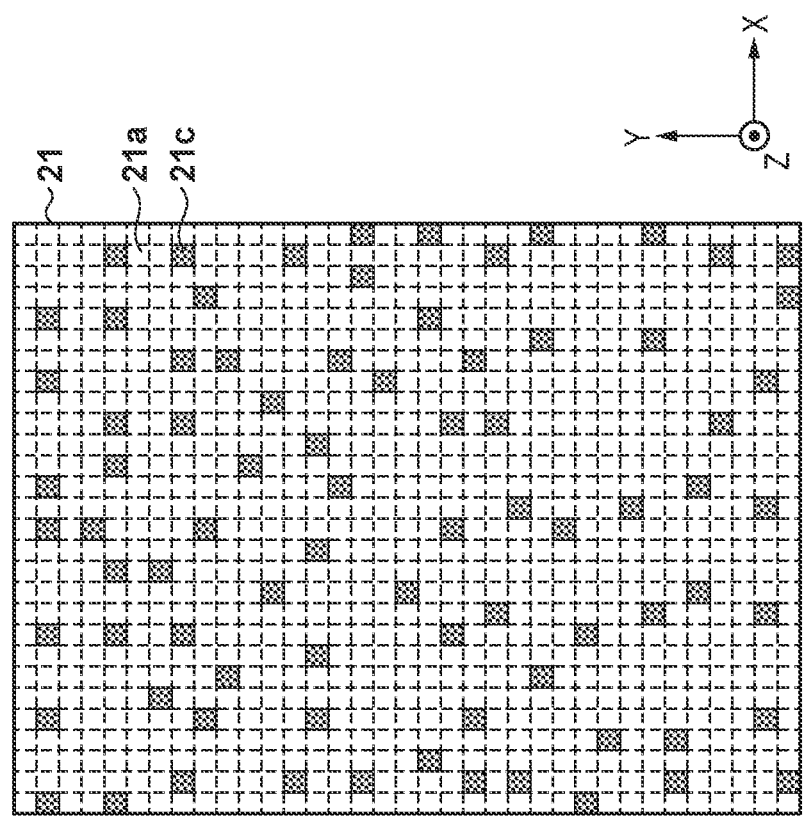

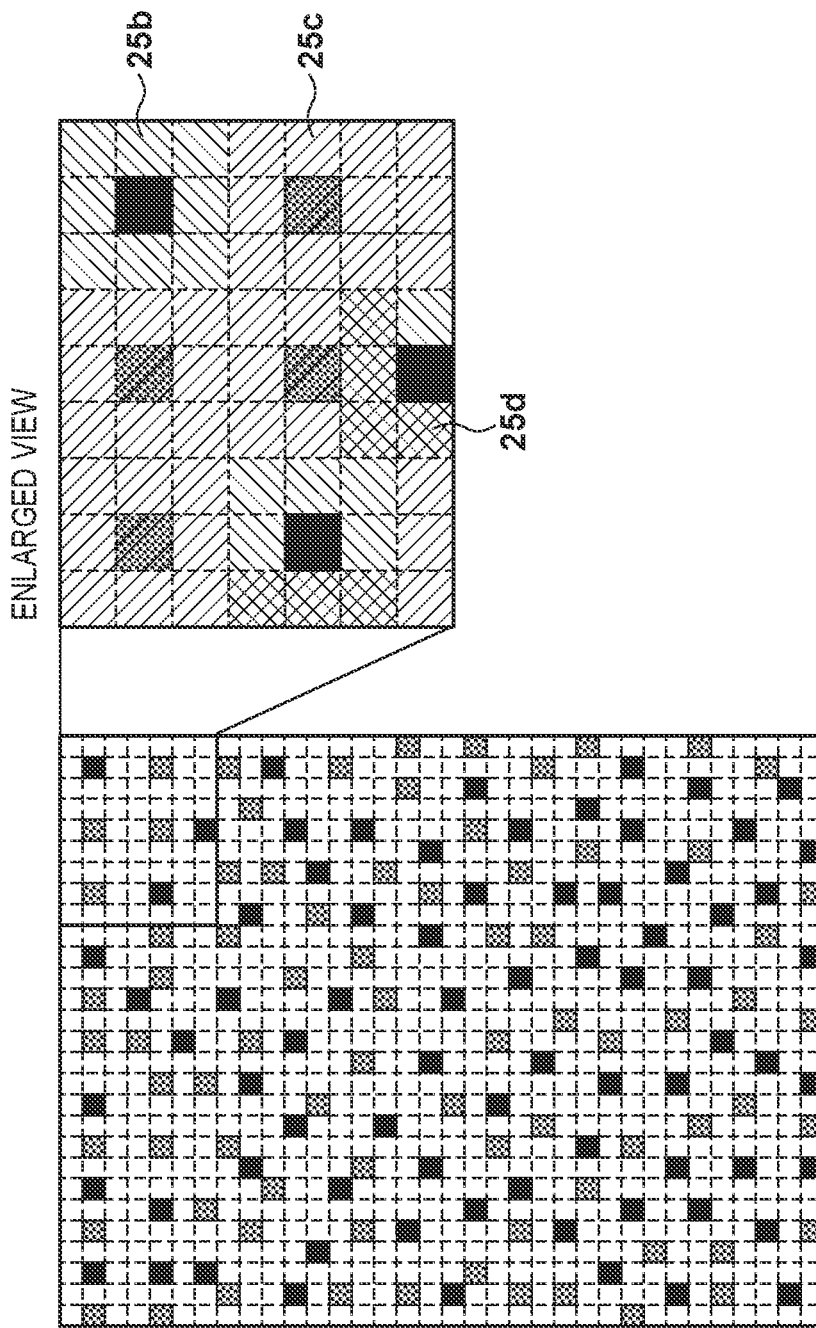

IMPRINT APPARATUS, IMPRINT METHOD, AND ARTICLE MANUFACTURING METHOD

BACKGROUND OF THE INVENTION

Field of the Invention

The present invention relates to an imprint apparatus, an imprint method, and an article manufacturing method.

Description of the Related Art

An imprint apparatus has been put into practice as a lithography apparatus for manufacturing articles such as magnetic storage media and semiconductor devices. The imprint apparatus forms a pattern of an imprint material on a substrate by bringing a mold, on which a pattern is formed, into contact with the imprint material on the substrate, curing the imprint material in contact with the mold, and then separating the mold from the cured imprint material.

Assume that a substrate is to be unloaded before imprint processing for all the shot regions of the substrate is complete upon occurrence of an error or the like. In this case, if the substrate is unloaded while an imprint material is uncured, a volatile component of the imprint material contaminates the surroundings. It is therefore necessary to take countermeasures against this problem. Japanese Patent Laid-Open No. 2016-149510 discloses a method of unloading a substrate outside an apparatus, upon occurrence of an error that disables the continuation of imprint processing, after stopping the imprint processing and curing an imprint material to stop volatilization of the imprint material on the substrate.

In order to form patterns with high accuracy and high throughput by using an imprint technique, it is necessary to reduce defects caused when molds are separated from imprint materials (defects caused by mold releasing). To reduce defects caused by mold releasing, it is important to improve the adhesiveness between imprint materials and substrates and mold releasing properties with respect to molds. A pattern forming method advantageous in reducing defects caused by mold releasing includes a method of stacking two types of compositions with different polymerization initiation properties on a substrate and using the mixed layer of the compositions as an imprint material. One of the two types of compositions can be a polymerizable composition substantially having no optical reactivity. As described above, it is sometimes necessary to unload a substrate by stopping imprint processing before the completion of the processing for all the shot regions of the substrate. Accordingly, such an imprint apparatus may stop processing after supplying a polymerizable composition having no optical reactivity as the first layer on a substrate before supplying a curable composition as the second layer.

Japanese Patent Laid-Open No. 2016-149510 gives consideration to only an imprint material having optical reactivity. For this reason, only applying the technique disclosed in Japanese Patent Laid-Open No. 2016-149510 to a polymerizable composition substantially having no optical reactivity will result in unloading a substrate with an uncured polymerizable composition from the imprint apparatus. As a consequence, a volatile component will inevitably contaminate the surroundings.

SUMMARY OF THE INVENTION

The present invention provides an imprint apparatus advantageous, for example, in reducing contamination by an uncured imprint material on a substrate.

According to one aspect of the present invention, an imprint apparatus performs imprint processing of supplying a second composition having a property of being cured onto a substrate to which a first composition not having a property of being cured in an uncured state is supplied, bringing a mold into contact with a mixed layer of the first composition and the second composition, which is formed by the supplying, curing the mixed layer, separating the mold from the cured mixed layer, and forming a pattern on the mixed layer. The apparatus comprises a supply unit configured to supply the second composition onto the first composition in a shot region of the substrate, a curing unit configured to cure the mixed layer, and a controller configured to control the supply unit and the curing unit, wherein when unloading the substrate outside the imprint apparatus before completion of the imprint processing for all shot regions of the substrate, the controller controls the supply unit and the curing unit to supply the second composition to a portion on the substrate in which the first composition is in an uncured state and perform curing processing of curing the mixed layer formed in the portion before the unloading.

Further features of the present invention will become apparent from the following description of exemplary embodiments (with reference to the attached drawings).

BRIEF DESCRIPTION OF THE DRAWINGS

FIG. 7 is a view showing a shot region after the curable composition A2 is supplied in accordance with the map in FIG. 4, together with an enlarged view of a partial region of the shot region;

FIG. 8 is a view exemplarily showing a map of a curable composition A3;

FIG. 9 is a view showing a map obtained by combining the map in FIG. 4 with the map in FIG. 8;

FIG. 10 is a view showing a shot region after the curable composition A2 and the curable composition A3 are supplied in accordance with the map in FIG. 9, together with an enlarged view of a partial region of the shot region;

DESCRIPTION OF THE EMBODIMENTS

Figure 1:
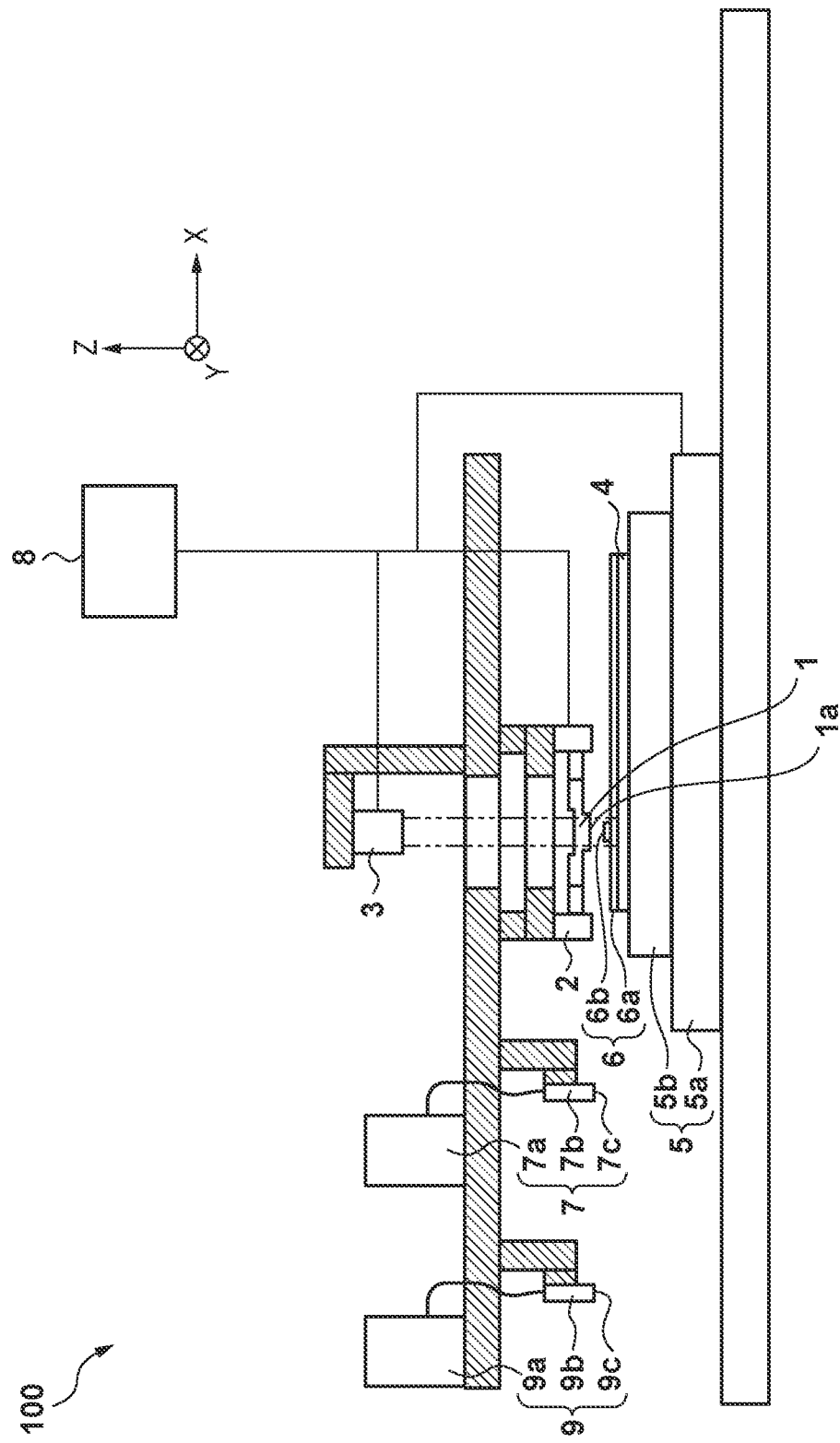
FIG. 1 is a view showing the arrangement of an imprint apparatus according to an embodiment.

Various exemplary embodiments, features, and aspects of the invention will be described in detail below with reference to the drawings.

The embodiments of the present invention will be described in detail below with reference to the accompanying drawings. Note that the following embodiments are merely specific examples of the embodiments of the present invention. The following embodiments do not limit the present invention. In addition, not all combinations of characteristic features described in the following embodiments are essential to solve the problems in the present invention. Note that the same reference numerals denote constituent elements throughout the drawings, and redundant descriptions will be omitted.

First Embodiment

An outline of an imprint apparatus according to an embodiment will be described first. The imprint apparatus is an apparatus that brings an imprint material supplied onto a substrate into contact with a mold and supplies curing energy to the imprint material to form a pattern of the cured material to which an indented pattern of the mold is transferred.

As an imprint material, a curable composition (to be sometimes called an uncured resin) that is cured upon application of curing energy can be used. As curing energy, electromagnetic waves, heat, or the like can be used. Electromagnetic waves can be, for example, light selected from the wavelength range of 10 nm or more and 1 mm or less, for example, infrared light, visible light, or ultraviolet light. A curable composition can be a composition that is cured by being irradiated with light or by being heated. Of these compositions, a photo-curable composition that is cured by being irradiated with light contains at least a polymerizable composition and a photopolymerization initiator, and may further contain a non-polymerizable component or a solvent, as needed. A non-polymerizable component is at least one type of component selected from the group consisting of a sensitizer, hydrogen donor, internal mold release agent, surfactant, antioxidant, and polymer component. Specific examples of compositions used for imprint materials according to this embodiment will be described later. An imprint material supply apparatus can arrange an imprint material on a substrate in the form of droplets or islands or films formed from a plurality of droplets connected to each other. The viscosity (at 25°) of the imprint material can be, for example, 1 mPa·s or more and 100 mPa·s or less. As a material for a substrate, for example, glass, ceramic, metal, semiconductor, or resin can be used. The surface of a substrate may be provided with a member made of a material different from that of the substrate, as needed. The substrate is, for example, a silicon substrate, compound semiconductor substrate, or silica glass substrate.

The imprint apparatus is used to manufacture semiconductor devices and the like, and performs imprint processing for molding an imprint material on a substrate by using a mold as described above. For example, the imprint apparatus cures an imprint material on a substrate while a mold on which an uneven pattern is formed is in contact with the imprint material. The imprint apparatus then can form a pattern formed from the imprint material on the substrate by increasing the space between the mold and the substrate and separating the cured imprint material from the mold. Methods of curing an imprint material include a heat-curing method using heat and a photo-curing method using light. This embodiment will exemplify a case in which the photo-curing method is used. The photo-curing method is a method of curing an uncured ultraviolet curable resin supplied as an imprint material onto a substrate by irradiating the imprint material with ultraviolet light while a mold is in contact with the imprint material. Although a case in which ultraviolet light is used as light will be described hereinafter, light having a different wavelength may be used to cure an imprint material.

[Arrangement of Imprint Apparatus]

The imprint apparatus according to this embodiment is configured to internally load a substrate coated in advance with an uncured polymerizable composition A1 (first composition) that does not substantially have the property of being cured upon reacting to light. The polymerizable composition A1 has no photoreactivity, and hence is not cured by being simply irradiated with light. In the embodiment, at the time of imprinting, a curable composition A2 (second composition) having the property of being cured upon reacting to light is supplied onto the polymerizable composition A1 to form an imprint material formed from a mixed layer of the polymerizable composition A1 and the curable composition A2 on a substrate. Although the polymerizable composition A1 alone is not cured by being irradiated with light, mixing the curable composition A2 with the polymerizable composition A1 enables the mixed layer to be cured by being irradiated with light. The embodiment uses this mixed layer as a pattern formation layer. Although another adhesion layer that is not included in a pattern formation layer may be interposed between the substrate and the polymerizable composition A1, an adhesion layer that does not form such a pattern formation layer will not be described below. The imprint apparatus according to this embodiment will be described in detail below.

FIG. 1 is a schematic view showing the arrangement of an imprint apparatus 100 according to this embodiment. The imprint apparatus 100 can include a mold holder 2 that holds a mold 1, a substrate holder 5 that holds a substrate 4, and a curing unit 3 that cures an imprint material 6 on the substrate 4 by irradiating the imprint material 6 with light. The imprint apparatus 100 can include a supply unit 7 (first supply unit) that supplies the curable composition A2 to the substrate 4, a supply unit 9 (second supply unit) that supplies a curable composition A3 to the substrate 4, and a controller 8 that controls each unit of the imprint apparatus 100. The controller 8 functions as a processor that includes, for example, a CPU and a memory, and comprehensively controls imprint processing.

The mold 1 is formed from a material that can transmit ultraviolet light, such as quartz. An uneven pattern for the formation of the imprint material 6 on a substrate is formed on a partial region (pattern region 1a) of the substrate-side surface of the mold 1. In addition, as the substrate 4, for example, a single-crystal silicon substrate or SOI (Silicon on Insulator) substrate can be used. The supply unit 7 (to be described later) supplies the curable composition A2 onto the upper surface (surface to be processed) of the substrate 4.

The mold holder 2 holds the mold 1 by, for example, vacuum suction force or electrostatic force, and drives the mold 1 in the Z direction so as to bring the pattern region 1a of the mold 1 into contact with the imprint material 6 on the substrate or separate the pattern region 1a from the imprint material 6. In addition to the function for driving the mold 1 in the Z direction, the mold holder 2 may have a function for adjusting the position of the mold 1 in the X and Y directions and the θ direction (the rotating direction around the Z axis) and a tilt function for correction the tilt of the mold 1.

The substrate holder 5 includes a substrate stage 5a and a substrate chuck 5b held by the substrate stage 5a. The substrate chuck 5b holds the substrate 4 by, for example, vacuum suction force or electrostatic force. The substrate stage 5a moves in the X and Y directions to position the substrate 4 in the X and Y directions. In addition to the function for moving the substrate 4 in the X and Y directions, the substrate holder 5 may have a function for moving the substrate 4 in the Z direction and an adjustment function for adjusting the position of the substrate 4 in the θ direction. In this case, in the imprint apparatus 100 according to this embodiment, the mold holder 2 operates to change the distance between the mold 1 and the substrate 4. However, this is not exhaustive. The substrate holder 5 may perform this operation or both the holders may relatively perform the operation.

The curing unit 3 cures the imprint material 6 arranged (stacked) on the substrate by irradiating the imprint material 6 with light. The curing unit 3 includes, for example, a light source for emitting light that cures the imprint material 6. The curing unit 3 may further include an optical element for adjusting light emitted from the light source to proper light. This embodiment uses a light source for emitting ultraviolet light because of the use of the photo-curing method. When, for example, using a heat-curing method, the embodiment uses a heat source for curing a heat-curing resin as the imprint material 6 in place of the light source.

The supply unit 7 can include a tank 7a that stores the curable composition A2 and a dispenser 7b that supplies the curable composition A2 stored in the tank 7a to a substrate. The dispenser 7b includes a plurality of nozzles 7c that discharge droplets of the curable composition A2 toward the substrate 4. The supply unit 7 arranges the curable composition A2 on a substrate by respectively causing the plurality of nozzles 7c to discharge droplets of the curable composition A2 while the substrate 4 and the supply unit 7 move relatively. When, for example, the plurality of nozzles 7c are arrayed along the Y direction, the supply unit 7 performs the process of arranging droplets of the curable composition A2 from the respective nozzles 7c on the substrate 4 while the substrate 4 moves in a direction (for example, the X direction) different from the arraying direction of the plurality of nozzles 7c. At this time, the controller 8 controls the plurality of nozzles 7c so as to discharge droplets in accordance with a map indicating the arrangement of the droplets of the curable composition A2 on a substrate. Droplets are densely arranged on a portion on the substrate which faces a region in which concave portions of the pattern region 1a of the mold 1 densely exist, whereas droplets are sparsely arranged on a portion of the substrate which faces a region in which concave portions sparsely exist. A map of the curable composition A2 is generated in advance based on the design information of an uneven pattern formed in the pattern region 1a of the mold 1. Alternatively, the controller 8 in the imprint apparatus 100 can generate such a map.

The supply unit 9 can include a tank 9a that stores the curable composition A3 and a dispenser 9b that supplies the curable composition A3 stored in the tank 9a to a substrate. The dispenser 9b includes a plurality of nozzles 9c each of which discharges a droplet of the curable composition A3 toward the substrate 4. A method of supplying the curable composition A3 to the substrate 4 by using the supply unit 9 can be the same as that using the supply unit 7. A map of the curable composition A3 will be described later.

[Compositions that Compose Imprint Material 6]

Compositions that compose the imprint material 6 used in this embodiment will be described. In the following description, a component a contained in the polymerizable composition A1 is written as a component a1, the component a contained in the curable composition A2 is written as a component a2, and the component a contained in the curable composition A3 is written as a component a3. The same applies to components b to e. Specific examples of the components a to e will be described later.

In this embodiment, the polymerizable composition A1 is a composition containing the component a1 that is at least a polymerizable compound. The polymerizable composition A1 may further contain a component c1 as a sensitizer, a component d1 as a non-polymerizable compound, and a component e1 as a solvent. Assume that the polymerizable composition A1 does not substantially have no photoreactivity. That is, the polymerizable composition A1 alone is not substantially cured even by irradiation with light.

In this embodiment, the curable composition A2 is a composition containing at least a component b2 as a photopolymerization initiator. The curable composition A2 may further contain the component a2 as a polymerizable compound, a component c2 as a sensitizer, a component d2 as a non-polymerizable compound, and a component e2 as a solvent.

In this embodiment, the curable composition A3 is a composition containing at least a component b3 as a photopolymerization initiator. The curable composition A3 may further contain the component a3 as a polymerizable compound, a component c3 as a sensitizer, a component d3 as a non-polymerizable compound, and a component e3 as a solvent.

Each component will be described below.

(Component a: Polymerizable Compound)

The component a is a polymerizable compound. In this specification, a polymerizable compound is a compound that reacts with a polymerization factor (a radical or the like) originating from the component b as a photopolymerization initiator to form a film formed from a polymer compound by a chain reaction (polymerization reaction).

Such a polymerizable compound includes, for example, a radical polymerizable compound. The component a as a polymerizable compound may be formed from only one type of polymerizable compound or a plurality of types of polymerizable compounds.

(Component b: Photopolymerization Initiator)

The component b is a photopolymerization initiator. In this specification, a photopolymerization initiator is a compound that generates a polymerization factor (radical) upon sensing light with a predetermined wavelength. More specifically, a photopolymerization initiator is a polymerization initiator (radial generating agent) that generates radicals with light (infrared light, visible light, ultraviolet light, far-ultraviolet light, X-rays, charged particle radiation such as an electron beam, or radiation).

The component b may be formed from one type of photopolymerization initiator or a plurality of types of photopolymerization initiators.

(Component c: Sensitizer)

The component c as a sensitizer is a compound that promotes the generation of optical radicals from the component b as a photopolymerization initiator when coexisting with the component b as a photopolymerization initiator. In addition, the component c as a sensitizer is defined as a compound that does not substantially have the ability to initialize optical radical polymerization by itself.

The polymerizable composition A1 contains the component c1 as a sensitizer. This is because the sensitization mechanism can improve photo-curability in the shot of the polymerizable composition A1 that does not substantially contain the component b1 as a photopolymerization initiator.

(Component d: Non-Polymerizable Component)

The polymerizable composition A1, the curable composition A2, and the curable composition A3 each can further contain a component d as a non-polymerizable compound in accordance with various purposes as long as the effects of the photopolymerization initiator are not degraded. The component d includes a compound that has no polymerizable functional group such as a (meta) acryloyl group and no ability to generate the above polymerization factor (radical) upon sensing light having a predetermined wavelength. For example, such compounds include a hydrogen donor, internal mold release agent, surfactant, antioxidant, polymer component, and other additives. Each composition may contain a plurality of types of compounds each described above as the component d.

(Component e: Solvent)

The polymerizable composition A1, the curable composition A2, and the curable composition A3 each can contain a solvent as the component e. The component e is not limited to any specific solvent as long as it dissolves the component a, the components b, the component c, and the component d. In this embodiment, a solvent used as the component e is, for example, a solvent whose boiling point is 80° C. or more and 200° C. or less at normal pressure. More specifically, a solvent used as the component e is a solvent that has at least one of an ester structure, ketone structure, hydroxyl group, and ether structure.

The polymerizable composition A1 according to this embodiment preferably contains the component e1. This is because a spin coating method is preferably used as a method of applying the polymerizable composition A1 onto a substrate. When the polymerizable composition A1 is to be arranged on a substrate by using the spin coating method, a baking process is executed as needed to volatilize the component e1 as a solvent.

[Imprint Processing]

Figure 2:
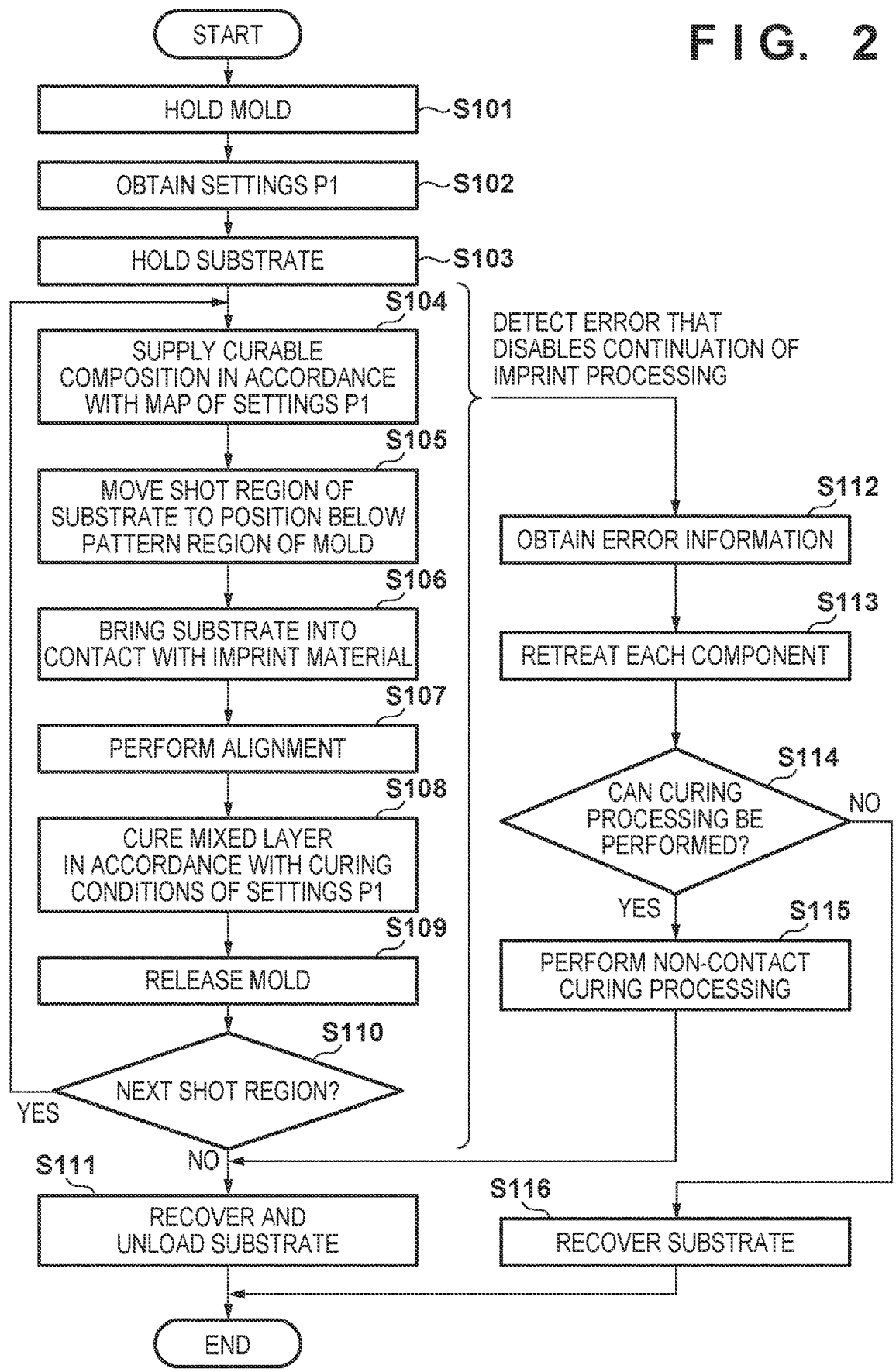
FIG. 2 is a flowchart for explaining imprint processing and error processing according to the embodiment.

Imprint processing and error processing in the imprint apparatus 100 will be described with reference to FIG. 2. In step S101, the controller 8 controls a mold transfer mechanism (not shown) to transfer the mold 1 to a position below the mold holder 2, and controls the mold holder 2 to hold the mold 1. The uneven pattern is formed in the pattern region 1a of the mold 1 in accordance with design information as described above, and the pattern region 1a is provided with identification information for identifying the pattern formed on the mold 1. The controller 8 causes a reading mechanism (not shown) to read the identification information of the mold 1 to obtain the identification information.

In step S102, the controller 8 obtains a map for controlling each of the plurality of nozzles 7c of the dispenser 7b based on the identification information of the mold 1 obtained in step S101. The map is information indicating specific positions in a shot region as an imprint processing target on the substrate at which a composition forming an imprint material is arranged. Examples of the map will be described later. In addition, the controller 8 obtains curing conditions (for example, an irradiation amount) for controlling light with which the imprint material 6 is irradiated by the curing unit 3. In the following description, a set of a map and curing conditions will be simply referred to as "settings" hereinafter. Settings P1 obtained in step S102 may be generated in advance based on the design information of the uneven pattern formed on the mold 1 or an experimental result or may be sequentially generated by reading the design information of a pattern from identification information.

In step S103, the controller 8 controls a substrate transfer mechanism (not shown) to load the substrate 4 coated with the polymerizable composition A1 into the imprint apparatus and further transfer the substrate 4 onto the substrate holder 5, and also controls the substrate holder 5 to hold the substrate 4. This arranges the substrate 4 in the imprint apparatus. Note that the polymerizable composition A1 is applied onto the substrate by using, for example, a spin coater (not shown) before the substrate is loaded into the imprint apparatus.

In step S104, the controller 8 controls the supply unit 7 to supply the curable composition A2 to a shot region to which the pattern of the mold 1 is to be transferred. For example, the controller 8 controls the respective nozzles 7c to discharge droplets in accordance with the map of the settings P1 obtained in step S102 while moving the substrate 4 in the X direction. This stacks the curable composition A2 as an imprint material 6b on the polymerizable composition A1 as an imprint material 6a in the shot region of the substrate 4.

In step S105, the controller 8 controls the substrate holder 5 to move the shot region to a position below the pattern region 1a of the mold 1. In step S106, the controller 8 controls the mold holder 2 to bring the pattern region 1a into contact with the imprint material 6 in the shot region. In step S107, the controller 8 performs positioning (alignment) between the pattern region 1a and the shot region while the pattern region 1a is in contact with the imprint material 6. For example, the controller 8 causes an alignment scope (not shown) to detect a mark provided on the mold 1 and a mark provided on the substrate 4, and controls the relative position between the pattern region 1a and the shot region by using the detected mark on the mold 1 and the detected mark on the substrate 4. The pattern region 1a and the imprint material 6 are left stand while being in contact with each other for a predetermined period of time to sufficiently fill the concave portions of the pattern region 1a with the imprint material 6 in the shot region. This presses and spreads the curable composition A2 discretely stacked on the polymerizable composition A1 on the shot region between the shot region and the pattern region 1a. This forms a mixed layer of the polymerizable composition A1 and the curable composition A2. This mixed layer spreads in the entire gap between the shot region and the pattern region 1a due to capillary action.

In step S108, the controller 8 controls the curing unit 3 to irradiate the imprint material 6 in contact with the mold 1 with light in accordance with the curing conditions of the settings P1 obtained in step S102 so as to cure the imprint material 6 (mixed layer). In step S109, the controller 8 controls the mold holder 2 to increase the distance between the mold 1 and the substrate 4 so as to separate the mold 1 from the imprint material 6 (mixed layer).

In step S110, the controller 8 determines whether there is any shot region (next shot region) on the substrate onto which the pattern of the mold 1 is to be transferred. If there is a next shot region, the process returns to step S104 to repeat processing for the next shot region. If there is no next shot region, the process advances to step S111. In step S111, the controller 8 recovers the substrate 4 from the substrate holder 5, and controls a substrate transfer mechanism (not shown) to unload the substrate 4 outside the imprint apparatus 100.

Next description is given for processing to be performed when a substrate is unloaded to the outside before the completion of pattern formation (imprint processing) with respect to all shot regions of a substrate (in the interval between step S104 and step S111) after it is held by the substrate holder. This processing can be processing to be performed when an error that disables the continuation of imprint processing before the completion of the imprint processing with respect to all the shot regions of the substrate. Alternatively, this processing can be processing to be performed upon detection of an operation instruction to stop processing from the user before the completion of imprint processing with respect to all the shot regions of the substrate. In such a case, the controller 8 stops the imprint processing, and shifts the process to the curing processing of curing an uncured portion of the imprint material on the substrate before the substrate is unloaded. In this embodiment, the controller 8 performs this curing processing without causing the mold 1 to come into contact with an uncured portion of the imprint material on the substrate (non-contact curing processing).

In step S112, the controller 8 obtains information for determining whether an error that has disabled the continuation of the pattern formation is an error that also disables non-contact curing processing. For example, this information is information that indicates whether each component of the imprint apparatus 100 required to execute non-contact curing processing is operating normally or in a restorable state. Components of the imprint apparatus 100 which are required to execute non-contact curing processing can be the controller 8, the substrate holder 5, the supply unit 9, and the curing unit 3. In addition, the controller 8 obtains information as conditions for non-contact curing processing. For example, the information can be information concerning the generation of a map indicating the arrangement of droplets of the curable composition A3, on the substrate, which cures the polymerizable composition Al. The information concerning the generation of a map can be information indicating the number of the shot region at which the processing of forming a pattern on the substrate is stopped and whether the curable composition A2 has been supplied to the corresponding shot region. The controller 8 further obtains information for deciding processing before the shift of the process to non-contact curing processing. For example, the information can be information indicating components of the imprint apparatus 100 which are required to execute non-contact curing processing and the positions of other components that can interfere with the required components. Other components that can interfere with the required components can be the mold holder 2 and the substrate transfer mechanism (not shown).

In step S113, based on the error information obtained in step S112, the controller 8 causes each component to retreat from a state at the time of stoppage of the processing of forming a pattern on a substrate to a position where the component does not interfere with the execution of non-contact curing processing. Components that need to be caused to retreat can include the mold holder 2 and the substrate transfer mechanism (not shown).

In step S114, the controller 8 determines, based on the error information obtained in step S112, whether non-contact curing processing can be executed. If, for example, there is an abnormality in a given component (for example, the dispenser) of the imprint apparatus which is required to execute the processing of curing the imprint material 6, the controller 8 determines that it is impossible to execute non-contact curing processing. If the controller 8 determines that it is impossible to execute non-contact curing processing, the process shifts to step S116, in which the controller 8 recovers the substrate 4 from the substrate holder 5 by using the substrate transfer mechanism (not shown). At this time, the imprint material 6 on the substrate 4 can be uncured, and hence can contaminate external devices and the like when unloaded from the imprint apparatus 100. In this case, therefore, the substrate 4 is preferably not unloaded from the imprint apparatus 100. For example, the imprint apparatus 100 may hold a container (not shown) containing a plurality of substrates formed by the imprint apparatus 100.

Upon determining that it is possible to execute non-contact curing processing, the controller 8 executes non-contact curing processing in step S115. Upon completion of the non-contact curing processing, the process shifts to step S111, in which the controller 8 controls the substrate transfer mechanism (not shown) to recover the substrate 4 from the substrate holder 5 and unload the substrate 4 from the imprint apparatus 100.

Example 1

Figure 3:
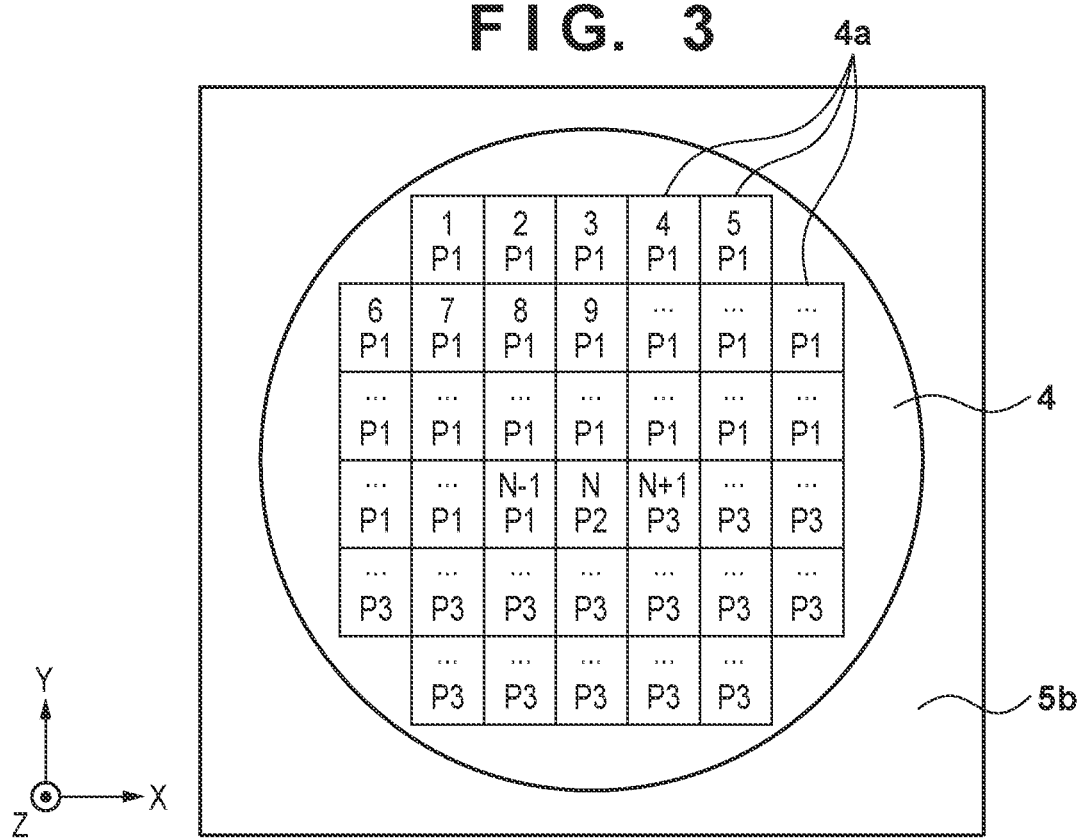
FIG. 3 is a view exemplarily showing a plurality of shot regions of a substrate.

Example 1 of non-contact curing processing in step S115 will be described next. FIG. 3 is a view showing an example of a plurality of shot regions of a substrate. Referring to FIG. 3, a substrate chuck 5*b* holds a substrate 4. A controller 8 proceeds with imprint processing in the order of consecutive shot regions 1, 2, 3, 4, . . . of the substrate 4 in accordance with the flowchart of FIG. 2.

Assume that the controller 8 has normally completed processing for shot regions 1 to N−1 in accordance with settings P1 obtained in step S102, and has detected an error that disables the continuation of imprint processing while shot region N was being processed in step S105. At this time, a curable composition A2 has been supplied to shot region N in accordance with the settings P1 in step S104.

Figure 4:
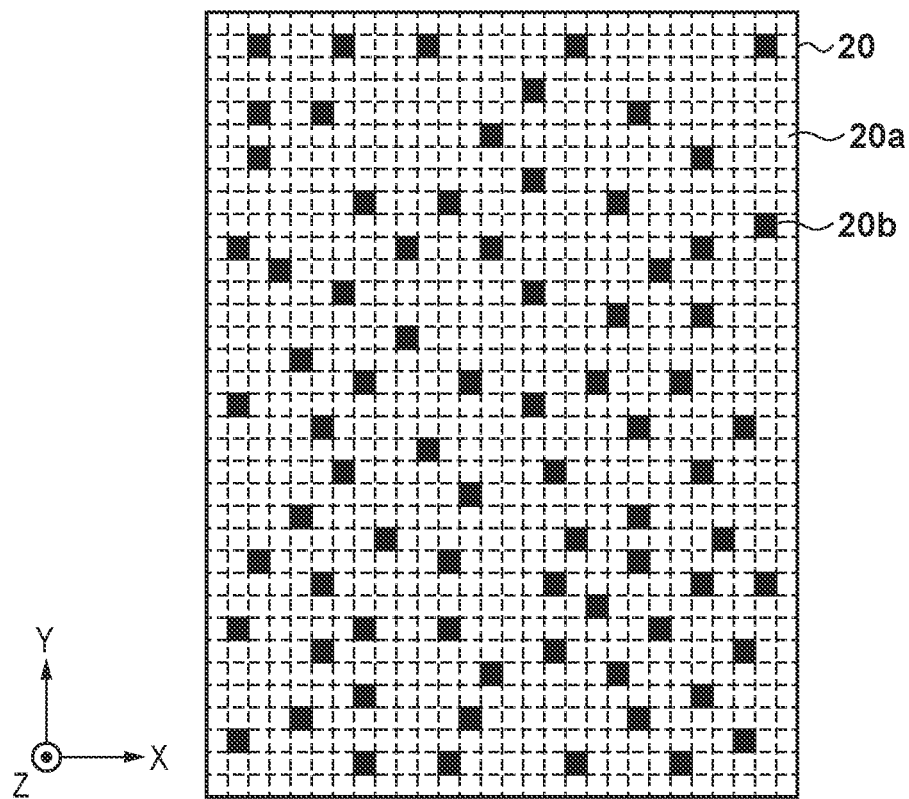
FIG. 4 is a view exemplarily showing a map of a curable composition A2.

FIG. 4 schematically shows an example of a map based on the settings P1. A map 20 indicates positions in a shot region of the substrate 4 to which the curable composition A2 is supplied (arranged). In the map 20, regions 20*a* are those in which a polymerizable composition A1 is arranged, and regions 20*b* are positions at which the polymerizable composition A1 is arranged, onto which the curable composition A2 is to be supplied.

FIG. 7 is a view showing a shot region after the curable composition A2 is supplied in accordance with the map 20 in FIG. 4, together with an enlarged view of a partial region of the shot region. This enlarged view shows an example of the state of the curable composition A2 after being supplied to the shot region in accordance with the map 20. Regions 24*a* are those coated with the polymerizable composition A1. The curable composition A2 is supplied onto the polymerizable composition A1 on regions 24*b*. The regions 24*b* spread as indicated by the hatching lines. As described above, the curable composition A2 stacked on the substrate is pressed and spreads between each shot region and a pattern region 1*a*. The mixed layer of the polymerizable composition A1 and the curable composition A2 spreads over the entire gap between the shot region and the pattern region 1*a* due to capillary action.

When, however, a mold 1 comes into contact with the curable composition A2, the curable composition A2 not sufficiently spreading over the polymerizable composition A1 in some region on the substrate can occur. The curing conditions of the settings P1 are conditions for curing based on the premise that the mixed layer of the polymerizable composition A1 and the curable composition A2 has spread over the entire gap between each shot region and the pattern region 1*a*. When the mold 1 does not come into contact with the curable composition A2, the curable composition A2 does not sufficiently spread, resulting in insufficient mixing with the polymerizable composition A1. Alternatively, an insufficient curing condition (for example, an insufficient irradiation amount) can generate an uncured region. When the substrate 4 is unloaded from the imprint apparatus while the polymerizable composition A1 is uncured, an apparatus that transfers the unloaded substrate and an external apparatus can be contaminated.

For this reason, the non-contact curing processing in step S115 is performed based on the premise that the mold 1 does not come into contact with a composition on a substrate. For example, the controller 8 controls a supply unit 9 to supply a curable composition A3 to a portion on a substrate in which the polymerizable composition A1 is uncured, and unloads the substrate outside the apparatus upon curing a mixed layer formed in the portion.

Figure 5:
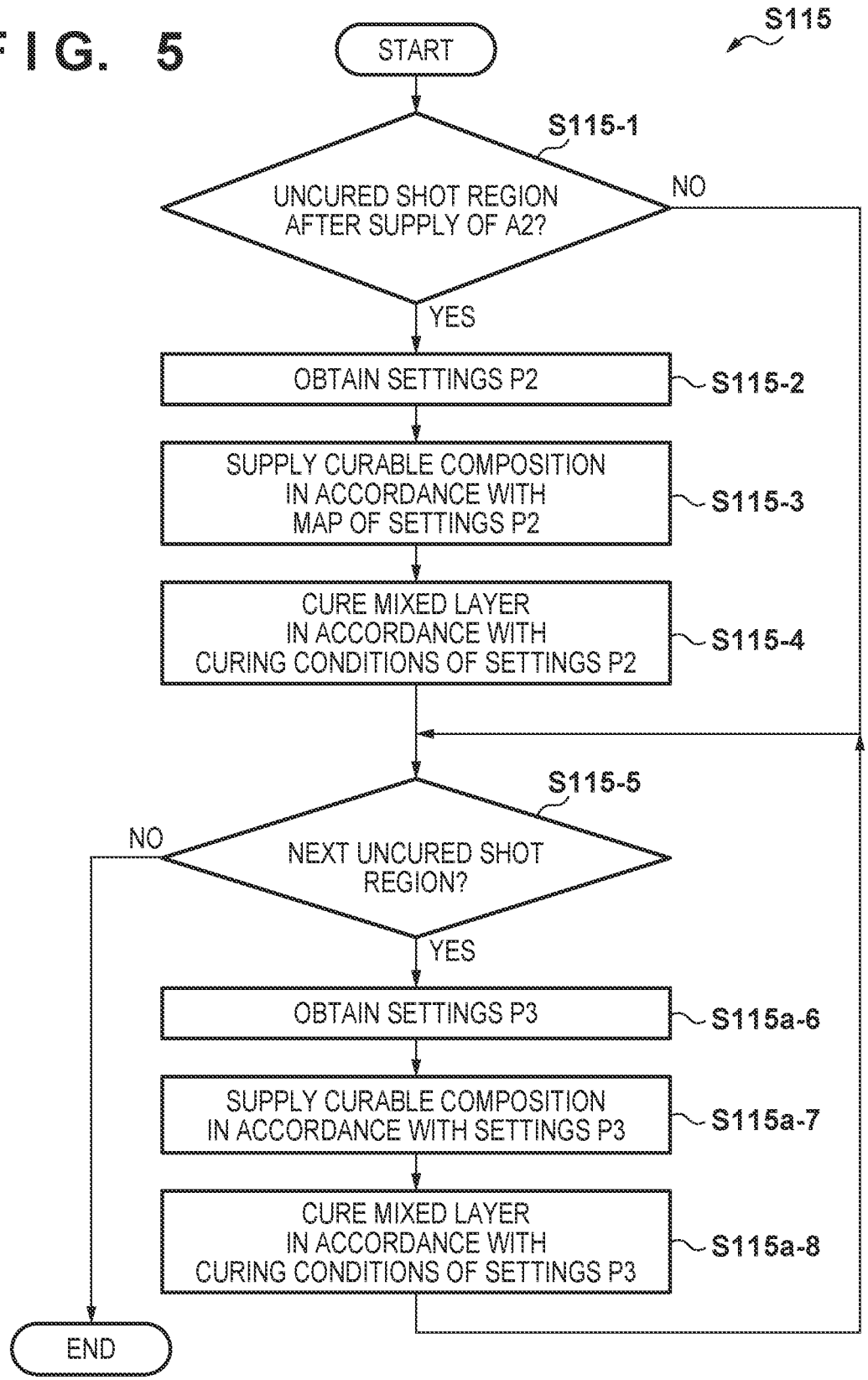
FIG. 5 is a flowchart showing non-contact curing processing according to Example 1.

FIG. 5 is a flowchart showing the details of non-contact curing processing according to Example 1. Assume that a region in which the curable composition A3 spreads a predetermined time after the curable composition A3 is supplied onto the polymerizable composition A1 is equal to that in which the curable composition A2 spreads in the same manner. Although the curable compositions A2 and A3 are handled as different compositions in this case, the curable compositions A2 and A3 may be identical as will be described in the second embodiment. That is, the curable compositions A2 and A3 can function as the second composition with respect to the first composition (polymerizable composition A1).

First of all, the controller 8 decides a map and curing conditions based on the information obtained in step S112. In step S115-1, the controller 8 determines whether there is a shot region including a portion in which the polymerizable composition A1 is uncured even after the curable composition A2 has been supplied in accordance with the map 20 of the settings P1. If there is a shot region including a portion in which the polymerizable composition A1 is uncured even after the curable composition A2 has been supplied, the controller 8 selects settings P2 for this state. The process then shifts to step S115-2. If there is no shot region having a portion in which the polymerizable composition A1 is uncured even after the curable composition A2 has been supplied, the process shifts to step S115-5. In step S115-5, the controller 8 determines whether there is a next shot region (uncured shot region) including a portion in which the applied polymerizable composition A1 is uncured. In this case, if there is a next uncured shot region, the controller 8 selects settings P3 for this state. The process then shifts to step S115a-6. If there is no next uncured shot region, the processing is terminated.

In curing processing for shot region N, the process shifts from step S115-1 to step S115-2. In step S115-2, the controller 8 obtains the settings P2. FIG. 8 schematically shows an example of a map 21 of the settings P2. In the map 21, a region 21a is a region coated with the polymerizable composition A1, and a region 21c is a region in which the curable composition A3 is stacked on the polymerizable composition A1 in step S115-3. In step S115-3, the controller 8 controls each nozzle 9c to discharge a droplet in accordance with the map 21 of the settings P2 obtained in step S115-2. With this operation, the curable composition A2 is stacked in shot region N in accordance with the map 20, and the curable composition A3 is stacked on the curable composition A2 in accordance with the map 21.

FIG. 9 shows a map 22 obtained by combining the map of the settings P1 with the map of the settings P2. Regions 22a of the map 22 indicate positions at which the polymerizable composition A1 is applied. Regions 22b indicate positions at which the curable composition A2 is supplied onto the polymerizable composition A1 in step S104. Regions 22c indicate positions at which the curable composition A3 is supplied onto the polymerizable composition A1 in step S115-3.

FIG. 10 is a view showing a shot region after the curable composition A2 and the curable composition A3 are supplied in accordance with the map 22 in FIG. 9, together with an enlarged view of a partial region of the shot region. This enlarged view shows the state of each composition after the curable compositions A2 and A3 are supplied to a shot region in accordance with the map 22. Regions 25b are those in which the curable composition A2 has been supplied onto the polymerizable composition A1 in step S104 and has spread after a lapse of a predetermined period of time. Regions 25c are those in which the curable composition A3 has been supplied onto the polymerizable composition A1 in step S115-3 and has spread after a lapse of a predetermined period of time. Regions 25d are those in which the curable composition A2 supplied in step S104 mixes with the curable composition A3 supplied in step S115-3. The regions 25d are those to which the curable composition A3 has been excessively supplied. Such regions preferably do not exist. If, however, a given region to which the curable composition A2 has not been supplied after step S104 is a gap smaller than a region of a droplet discharged from a nozzle 9c on the substrate, such a region can appear. A map used to stack the curable composition A3 in a shot region to which the curable composition A2 has been supplied is preferably generated so as to fill regions to which the curable composition A2 has not been supplied and reduce regions in which the curable composition A3 mixes with the curable composition A2. A map of the curable composition A3 is generated in advance based on an experimental result. Alternatively, the controller 8 in an imprint apparatus 100 can generate a map of the curable composition A3 based on the map of the curable composition A2.

In step S115-4, the controller 8 controls a substrate holder 5 to arrange a shot region, in which the curable composition A3 is stacked on the polymerizable composition A1, in a region to be irradiated with light by the curing unit 3. The controller 8 then controls the curing unit 3 to emit light in accordance with the curing conditions obtained in step S115-2 to cure the composition in the shot region. In this case, the curing conditions are conditions based on the premise that the distribution of the curable composition A2 and the curable composition A3 is that shown in FIG. 10. As a result of mixing between the polymerizable composition A1 and the curable composition A3, a component b3 as a photopolymerization initiator of the curable composition A3 also shifts to the polymerizable composition A1 to make the polymerizable composition A1 have photosensitivity. Accordingly, both the polymerizable composition A1 and the curable composition A3 are cured by irradiation with applied light. With the above processing, the mixed layer of the polymerizable composition A1 and the curable composition A3 in shot region N is cured.

Figure 11:
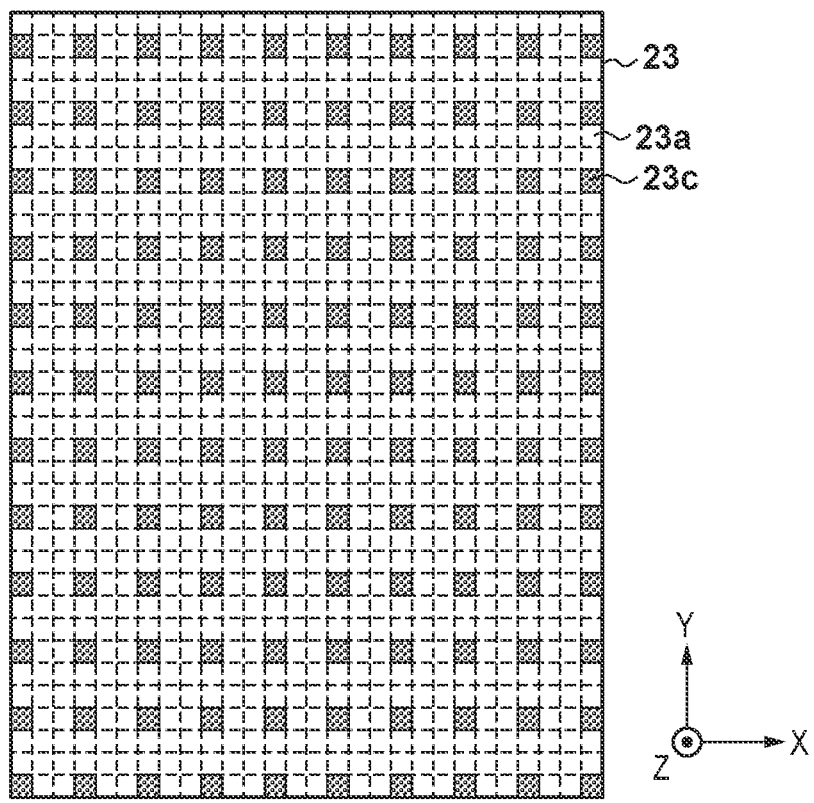
FIG. 11 is a view exemplarily showing a map of the curable composition A3.

In curing processing for next shot region N+1, the process shifts from step S115-5 to step S115a-6. In step S115a-6, the controller 8 obtains the settings P3 for curing the polymerizable composition A1 to which the curable composition A2 has not been supplied in step S104. FIG. 11 is a view schematically showing an example of a map of the curable composition A3 in the settings P3. In a map 23, regions 23a indicate positions at which the polymerizable composition A1 is applied, and regions 23c indicate positions at which the curable composition A3 is supplied onto the polymerizable composition A1 in step S115a-7. In step S115a-7, the controller 8 controls each nozzle 9c to discharge a droplet in accordance with the map of the settings P3 obtained in step S115a-6. With this operation, the curable composition A3 is stacked in shot region N+1 in accordance with the map 23.

Figure 12:
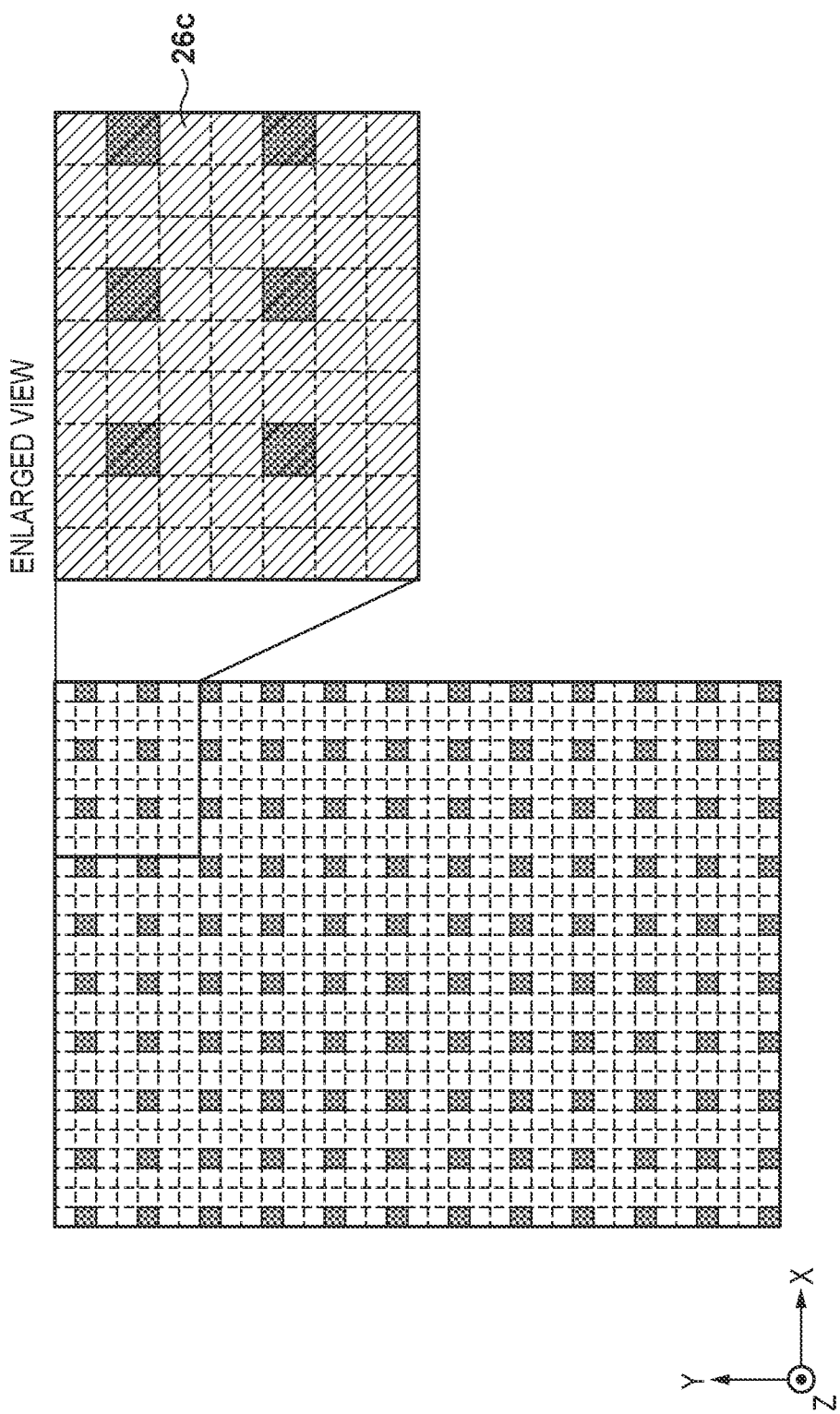
FIG. 12 is a view showing a shot region after the curable composition A3 is supplied in accordance with the map in FIG. 11, together with an enlarged view of a partial region of the shot region.

FIG. 12 is a view schematically showing a shot region after the curable composition A3 is supplied in accordance with the map 23 in FIG. 11, together with an enlarged view of a partial region of the shot region. Regions 26c are those in which the curable composition A3 has been supplied onto the polymerizable composition A1 in step S115a-7 and has spread after a lapse of a predetermined period of time. When the nozzles 9c discharge droplets onto a substrate, it is preferable that regions in which the curable composition A3 has not been stacked are small, and overlapping between adjacent droplets is small. It is possible to shorten the processing time by reducing the consumption of the curable composition A3 and shortening a curing condition (for example, the irradiation time of light). A map used to supply the curable composition A3 to a shot region to which the curable composition A2 has not been supplied is preferably generated to fill the shot region with the curable composition A3 and reduce regions in which adjacent layers of the curable composition A3 mix with each other. A map of the curable composition A3 can be generated in advance based on an experimental result. Alternatively, the controller 8 may generate a map of the curable composition A3.

In step S115a-8, the controller 8 controls the substrate holder 5 to arrange a shot region, in which the curable composition A3 is stacked, in a region irradiated with light by the curing unit. The controller 8 then controls the curing unit 3 to irradiate the composition of the shot region with light in accordance with the curing conditions obtained in step S115a-6, thereby curing the composition. The curing conditions in this case are conditions based on the premise that the distribution of the curable composition A3 is that shown in FIG. 12. The above processing cures the mixed layer of the polymerizable composition A1 and the curable composition A3 in shot region N+1.

The controller 8 proceeds with the processing for shot regions after shot region N+1, that is, shot regions N+2, N+3, . . . up to the final shot region in accordance with the same procedure as that for shot region N+1. This cures the mixed layer of the polymerizable composition A1 and the curable composition A3 in each of shot regions N+2, N+3, . . . .

Example 2

Figure 6:
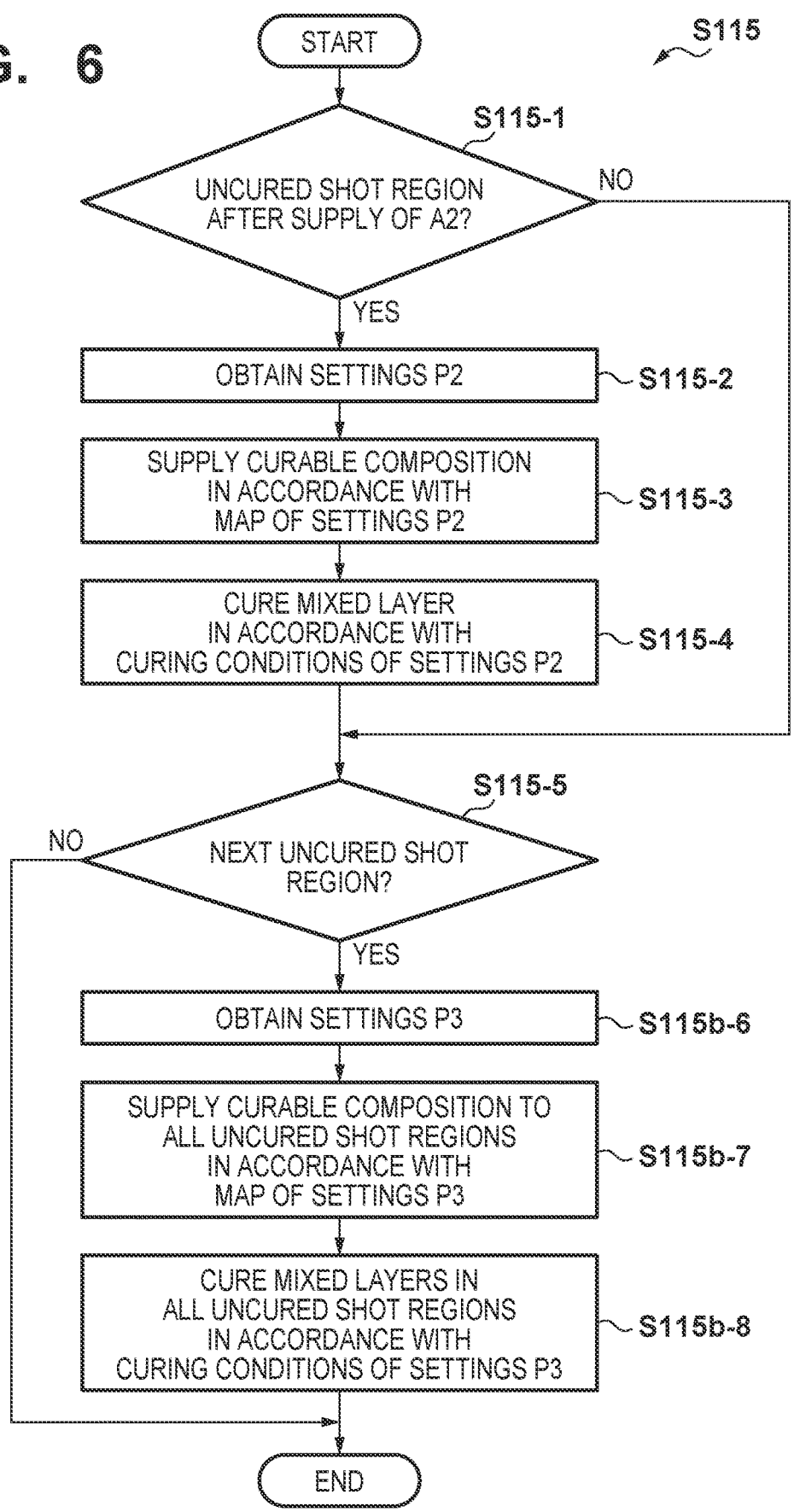
FIG. 6 is a flowchart showing non-contact curing processing according to Example 2.

Example 2 of non-contact curing processing in step S115 will be described next. In Example 1, the curable composition A3 is supplied to a portion on the substrate in which the polymerizable composition A1 is uncured, and the mixed layer formed in the portion is cured. This processing is performed for each shot region having such a portion. In contrast to this, in Example 2, the curable composition A3 is supplied to a portion on the substrate in which the polymerizable composition A1 is uncured, and the mixed layer formed in the portion is cured. This processing is collectively performed for all shot regions having such portions. FIG. 6 is a flowchart for non-contact curing processing in Example 2. In Example 2, after the curable composition A3 is supplied to a plurality of shot regions each having a portion in which the polymerizable composition A1 is uncured, the mixed layers of the polymerizable composition A1 and the curable composition A3 are collectively cured.

In steps S115-1 to S115-5, a controller 8 performs the same processing as that in Example 1. In curing processing for shot regions N+1, N+2, . . . , the process shifts from step S115-5 to step S115b-6. In step S115b-6, the controller 8 obtains settings P3 for curing the composition without a curable composition A2 being supplied in step S104.

In step S115b-7, the controller 8 controls each nozzle 9c to discharge a droplet with respect to shot regions N+1, N+2, . . . up to the final shot region in the order named in accordance with the map obtained in step S115b-6. With this processing, the curable composition A3 is stacked in regions N+1, N+2, . . . in accordance with a map 23.

In step S115b-8, the controller 8 controls a substrate holder 5 to arrange shot region N+1, in which the curable composition A3 is stacked, in a region to be irradiated with light by a curing unit 3. The controller 8 controls the curing unit 3 to irradiate the composition in the shot region so as to cure the composition in accordance with the curing conditions obtained in step S115b-6. In this case, the curing of the respective compositions in adjacent shot regions can progress. Because the purpose of Example 2 is not to form a pattern, Example 2 does not regard such a way of curing as a problem. If, however, only a specific shot region is to be cured, the same processing as that in Example 1 may be performed. The controller 8 then processes shot regions after shot region N+1, that is, shot regions N+2, N+3, . . . up to the final shot region in the same manner as described above. This cures the mixed layers of the polymerizable composition A1 and the curable composition A3 in shot regions N+1, N+2, N+3, . . . .

Throughout the above processing, an imprint apparatus 100 unloads a substrate 4 from the imprint apparatus 100 while the respective compositions in all the shot regions on the substrate are cured. This can reduce (prevent) contamination of the surroundings of an uncured imprint material 6 on a substrate by chemical substances from the imprint material 6.

Note that the entire uncured imprint material 6 on the substrate need not be cured although the effect of reducing contamination deteriorates. For example, it is possible to use settings that cure only the surface layer of the imprint material 6 which comes into contact with the surrounding atmosphere. These settings are advantageous in terms of at least one of the consumption amount of the curable composition A2 and the processing time required for non-contact curing processing than the settings for curing the entire uncured imprint material 6.

Second Embodiment

Figure 13:
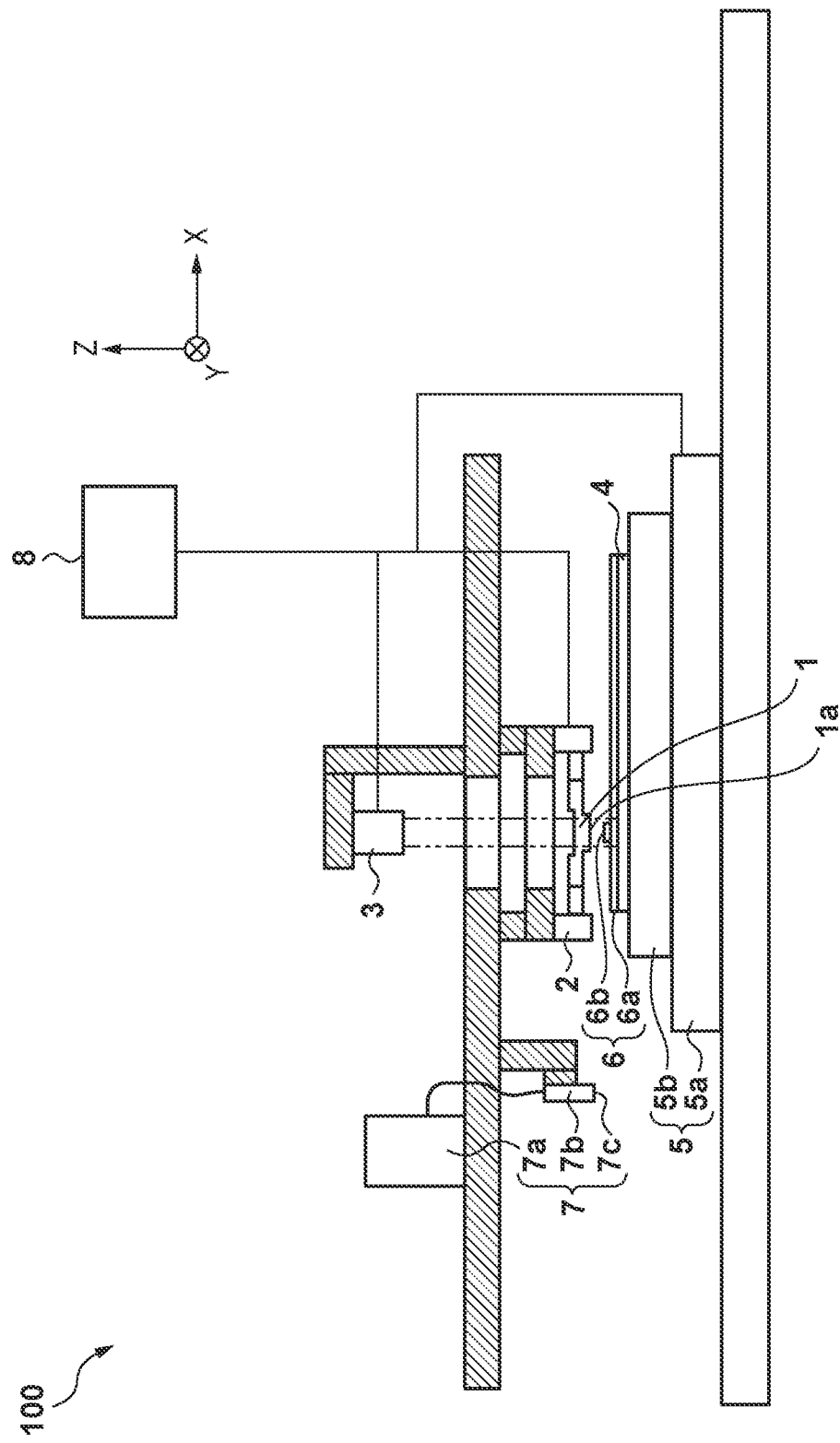
FIG. 13 is a view showing the arrangement of an imprint apparatus according to an embodiment.

The first embodiment has exemplified the curable compositions A2 and A3 as different compositions. However, identical compositions may be used as the above compositions. FIG. 13 shows a modification of the arrangement of the imprint apparatus 100 shown in FIG. 1. This imprint apparatus differs from the imprint apparatus shown in FIG. 1 in that the supply unit 9 for supplying the curable composition A3 is omitted from the arrangement shown in FIG. 13. According to the aspect shown in FIG. 13, a curable composition A2 is used as a curable composition A3, and a supply unit 7 also has the function for the supply unit 9. That is, in the arrangement shown in FIG. 13, when unloading a substrate to the outside before the completion of imprint processing for all shot regions, a controller 8 supplies the curable composition A2 (second composition) to portions in which a polymerizable composition A1 (first composition) on the substrate is uncured. Thereafter, the controller 8 unloads the substrate to the outside upon curing the mixed layers formed in the portions.

The imprint apparatus according to this embodiment is superior to the imprint apparatus according to the first embodiment in that it is possible to simplify the arrangement. Note however that when an error in the supply unit 7 makes it impossible to continue imprint processing, the imprint apparatus according to this embodiment cannot perform non-contact curing processing. That is, the imprint apparatus according to the first embodiment is advantageous in that it can continue non-contact curing processing by using the supply unit 9 even when an error in the supply unit 7 disables the continuation of imprint processing.

Embodiment of Article Manufacturing Method

A pattern of a cured product formed by using an imprint apparatus is used permanently for at least some of various articles or used temporarily when the various articles are manufactured. The article includes an electric circuit element, an optical element, a MEMS, a printing element, a sensor, a mold, or the like. The electric circuit element includes, for example, a volatile or nonvolatile semiconductor memory such as a DRAM, an SRAM, a flash memory, or an MRAM or a semiconductor element such as an LSI, a CCD, an image sensor, or an FPGA. The mold includes, for example, an imprinting mold.

The pattern of the cured product is used without any change as a constituent member of at least a part of the above-described article or used temporarily as a resist mask. The resist mask is removed after etching, ion implantation, or the like is performed in a processing step of the substrate.

Figure 14:
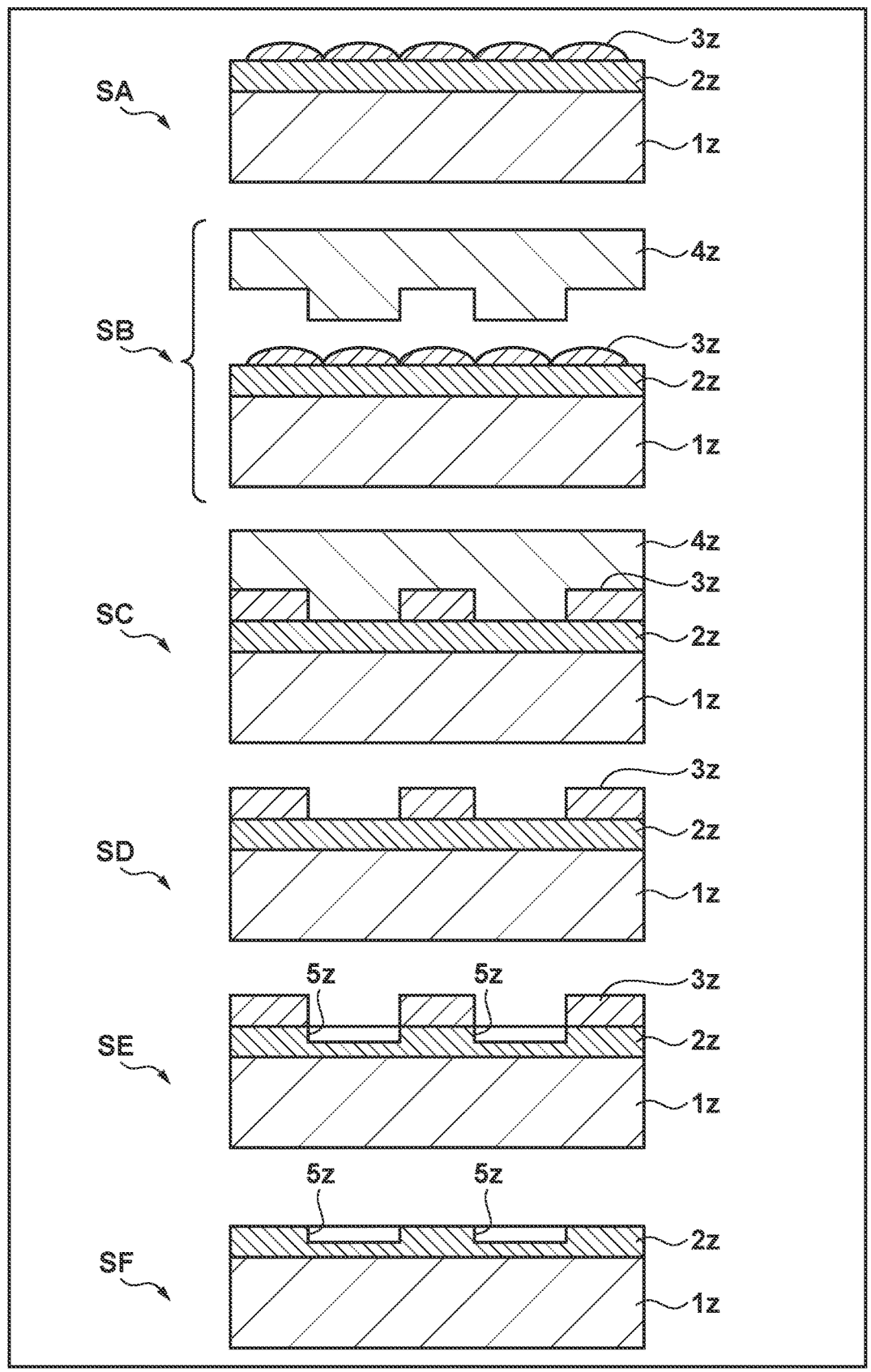
FIG. 14 is a view for explaining an article manufacturing method according to an embodiment.

An article manufacturing method will now be described with reference to FIG. 14. In step SA, a substrate $1z$ such as a silicon substrate having a processing target material $2z$ such as an insulator formed on its surface is prepared, and then an imprint material $3z$ is applied on the surface of the processing target material $2z$ by an inkjet method or the like. A state is shown here in which the imprint material $3z$ formed into a plurality of droplets is applied on the substrate.

In step SB, a side of an imprinting mold $4z$ on which its three-dimensional pattern is formed faces the imprint material $3z$ on the substrate. In step SC, the mold $4z$ and the substrate $1z$ to which the imprint material $3z$ is applied are brought into contact with each other, and a pressure is applied. The imprint material $3z$ fills the gap between the mold $4z$ and the processing target material $2z$. The imprint material $3z$ is cured by irradiating it with light as curing energy through the mold $4z$ in this state.

In step SD, the pattern of the cured product of the imprint material $3z$ is formed on the substrate $1z$ by separating the mold $4z$ and the substrate $1z$ from each other after curing the imprint material $3z$. The pattern of this cured product has a shape in which the concave portion of the mold corresponds to the convex portion of the cured product and the convex portion of the mold corresponds to the concave portion of the cured product. That is, the three-dimensional pattern of the mold $4z$ is transferred to the imprint material $3z$.

In step SE, out of the surface of the processing target material $2z$, portions without the cured product or portions where the cured products remain thin are removed and become grooves $5z$ by performing etching using the pattern of the cured product as an etching resistant mold. In step SF, an article having the grooves $5z$ formed in the surface of the processing target material $2z$ can be obtained by removing the pattern of the cured product. The pattern of the cured product is removed here. However, the pattern of the cured product may be utilized as, for example, an interlayer dielectric film included in the semiconductor element or the like, that is, the constituent member of the article without removing it after processing.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-040920, filed Mar. 3, 2017, which is hereby incorporated by reference herein in its entirety.

What is claimed is:

1. An imprint apparatus that performs imprint processing for forming a pattern of an imprint material on a substrate by bringing a mold into contact with the imprint material, curing the imprint material, and separating the mold from the cured imprint material, the apparatus comprising:

a supply unit configured to supply a second composition having a curable property onto a shot region of the substrate to which a first composition having no curable property in an uncured state is supplied in advance, wherein the first composition and the second composition merge, and as a result, the imprint material, which has a curable property in an uncured state, is created;

a curing unit configured to cure the imprint material; and a controller configured to control the supply unit and the curing unit, wherein in a case where the substrate is to be unloaded to outside the imprint apparatus before completion of the imprint processing for all shot regions of the substrate, the controller controls the supply unit and the curing unit to supply the second composition onto a portion of the substrate in which the first composition is in an uncured state to create a material having a curable property in an uncured state by the first composition and the second composition being merged, and perform curing processing of curing the material formed on the portion before the unloading.

2. The apparatus according to claim 1, wherein the controller performs the curing processing without bringing the mold into contact with the material formed on the portion.

3. The apparatus according to claim 1, wherein the supply unit comprises
   a first supply unit configured to supply the second composition for the imprint processing, and
   a second supply unit configured to supply the second composition for the curing processing.

4. The apparatus according to claim 1, wherein the controller performs the curing processing for each shot region having the portion.

5. The apparatus according to claim 1, wherein the controller collectively performs the curing processing for all shot regions each having the portion.

6. The apparatus according to claim 1, wherein the controller performs the curing processing when an error that disables continuation of the imprint processing is detected before completion of imprint processing for all the shot regions.

7. The imprint apparatus according to claim 1, wherein the controller performs the curing processing when an operation instruction to stop processing from a user is detected before completion of imprint processing for all the shot regions.

8. An imprint method using an imprint apparatus that forms a pattern on a substrate by using a mold, the method comprising:
   loading the substrate on which a first composition having no curable property in an uncured state is supplied and causing a substrate holder to hold the substrate;
   supplying a second composition having a curable property onto a shot region of the substrate held by the substrate holder, wherein the first composition and the second composition merge, and as a result, the imprint material, which has a curable property in an uncured state, is created;
   performing imprint processing of curing the imprint material on the shot region while the imprint material is in contact with the mold, and separating the mold from the cured imprint material; and
   supplying, in a case where the substrate is to be unloaded to outside the imprint apparatus before completion of the imprint processing for all shot regions of the substrate, the second composition onto a portion of the substrate in which the first composition is in an uncured state to create a material having a curable property in an uncured state by the first composition and the second composition being merged, and curing the material formed on the portion before the unloading.

9. An article manufacturing method comprising:
   forming a pattern on a substrate by using an imprint apparatus;
   processing the substrate on which the pattern has been formed in the forming; and
   manufacturing an article from the substrate processed in the processing,
   wherein the imprint apparatus performs imprint processing for forming a pattern of an imprint material on a substrate by bringing a mold into contact with the imprint material, curing the imprint material, and separating the mold from the cured imprint material, the imprint apparatus comprises:
   a supply unit configured to supply a second composition having a curable property onto a shot region of the substrate to which a first composition having no curable property in an uncured state is supplied in advance, wherein the first composition and the second composition merge, and as a result, the imprint material, which has a curable property in an uncured state, is created;
   a curing unit configured to cure the imprint material; and
   a controller configured to control the supply unit and the curing unit,
   wherein in a case where the substrate is to be unloaded to outside the imprint apparatus before completion of the imprint processing for all shot regions of the substrate, the controller controls the supply unit and the curing unit to supply the second composition onto a portion of the substrate in which the first composition is in an uncured state to create a material having a curable property in an uncured state by the first composition and the second composition being merged, and perform curing processing of curing the material formed on the portion before the unloading.

* * * * *